United States Patent [19]

Calhoun et al.

[11] Patent Number: 5,275,856
[45] Date of Patent: Jan. 4, 1994

[54] ELECTRICALLY CONDUCTIVE ADHESIVE WEB

[75] Inventors: Clyde D. Calhoun, Stillwater; David C. Koskenmaki, St. Paul, both of Minn.

[73] Assignee: Minnesota Mining and Manufacturing Company, St. Paul, Minn.

[21] Appl. No.: 15,285

[22] Filed: Feb. 8, 1993

Related U.S. Application Data

[63] Continuation of Ser. No. 791,586, Nov. 12, 1991, abandoned.

[51] Int. Cl.$^5$ .................. C09J 7/02; C09J 9/02
[52] U.S. Cl. .................. 428/40; 428/343; 428/344; 428/349; 428/354; 428/356
[58] Field of Search .......... 428/40, 343, 344, 345, 428/354, 356, 349

[56] References Cited

U.S. PATENT DOCUMENTS

| | | | |
|---|---|---|---|
| 2,822,509 | 2/1958 | Harvey | 317/2 |
| 3,326,741 | 6/1967 | Olson | 161/184 |
| 3,347,978 | 10/1967 | Simon et al. | 174/84 |
| 3,753,755 | 8/1973 | Olson | 117/3.1 |
| 4,008,300 | 2/1977 | Ponn | 264/104 |
| 4,304,705 | 12/1981 | Heilmann et al. | 260/30.4 |
| 4,329,384 | 5/1982 | Vesley et al. | 428/40 |
| 4,330,590 | 5/1982 | Vesley | 428/336 |
| 4,379,201 | 4/1983 | Heilmann et al. | 428/345 |
| 4,457,796 | 7/1984 | Needham | 156/182 |
| 4,546,037 | 10/1985 | King | 428/323 |
| 4,606,962 | 8/1986 | Reylek et al. | 428/148 |
| 4,737,112 | 4/1988 | Jin | 428/900 |
| 4,769,399 | 9/1988 | Schenz | 523/213 |
| 4,880,683 | 11/1989 | Stow | 428/200 |
| 5,087,494 | 2/1992 | Calhoun | 428/40 |

FOREIGN PATENT DOCUMENTS 63-86322  4/1988  Japan .................. 428/344

*Primary Examiner*—Jenna L. Davis
*Attorney, Agent, or Firm*—Gary L. Griswold; Walter N. Kirn; Darla P. Neaveill

[57] ABSTRACT

Electrical conductive adhesive tapes comprising at least one carrier web having a low-adhesion face bearing thereon an adhesive layer having substantially uniform thickness and a Lap Shear Value from aluminum of at least 0.2 MPa, said tape being formed having a plurality of perforations, each perforation containing a plurality of electrically conductive particles in contact with the adhesive layer which is otherwise substantially free from electrically conductive material.

20 Claims, 1 Drawing Sheet

ELECTRICALLY CONDUCTIVE ADHESIVE WEB

This is a continuation of application Ser. No. 07/791,586 filed Nov. 12, 1991, now abandoned.

BACKGROUND OF THE INVENTION

1. Field of the Invention

This invention relates to electrically conductive adhesive webs and to methods of making them. In one embodiment, the invention relates to such web where the adhesive is normally tacky and pressure-sensitive, preferably aggressively tacky.

2. Description of the Related Art

Modern electrical devices are becoming so small that it is frequently virtually impossible to interconnect electrodes of two such devices either mechanically or by soldering. For many years there have been attempts to devise electrically conductive adhesives, and numerous U.S. patents have been issued of such products.

For example, U.S. Pat. No. 3,347,978 discloses electrically conductive joints and gaskets where an adhesive containing a mass of electrically conductive fibers is used to bond two metal members.

In the field of pressure-sensitive adhesives, U.S. Pat. No. 2,822,509 discloses an adhesive plaster having a conductive backing and an adhesive containing conductive particles. U.S. Pat. 4,606,962 describes a pressure-sensitive adhesive layer incorporating conductive metal-coated particles, which are somewhat thicker than the adhesive layer. U.S. Pat. No. 4,457,796 discloses a pressure-sensitive transfer adhesive containing chopped metal fibers to impart localized electrical conductivity.

Where it is important to have an adhesive that possesses both good electrical conductivity and good adhesion, most of the adhesive constructions discussed in the preceding paragraph have had serious problems. If a large quantity of conductive particles or fibers is blended with the adhesive, electrical conductivity is excellent, but adhesive properties are significantly reduced. Correspondingly, if a small quantity of conductive particles or fibers is used, adhesive properties are adequate, but the electrical conductivity is frequently too low to be acceptable. The problem is exacerbated where thick adhesive layers are required.

In a related nonadhesive development, U.S. Pat. No. 4,008,300 discloses a foraminous elastomeric film in which the perforations are filled with a hardened electrically conductive slurry that bulges beyond both faces of the elastomer. A major disadvantage of this film is that mechanical clamping is still required in order to maintain the electrical connections. When clamped between flat surfaces, lateral forcible expansion of the individual rods puts them under pressure, thus assuring that each rod electrically interconnects facing pairs of electrical terminals on the flat surfaces.

In certain industries, e.g., manufacture of heavy appliances and the like, metal panels are typically spot welded or riveted together to form the enclosure for the appliance. While these methods of joining the panels provide both mechanical strength and electrical continuity, skilled operators are required and the inevitable disruption of the metal surface requires an additional abrading step to restore a smooth surface. It has long been recognized that an aggressive adhesive construction having excellent electrical properties would be more convenient to use, but no such construction has actually been available.

It has now been discovered that an electrically conductive adhesive tape having good electrical properties may be formed using a very small amount of conductive particles which are contained in perforations in the tape.

It has also been discovered that such a tape can be made without sacrificing adhesive properties such as peel and sheer.

SUMMARY OF THE INVENTION

The invention provides electrically conductive adhesive tapes comprising at least one carrier web having a low-adhesion face bearing thereon an adhesive layer having substantially uniform thickness and a Lap Shear Value from aluminum of at least 0.2 MPa, said tape being formed having a plurality of perforations, each perforation containing a plurality of electrically conductive particles in contact with the adhesive layer which is otherwise substantially free from electrically conductive material. The carrier web may be permanently or releaseably attached thereto.

The invention also provides foam tapes having aggressively tacky adhesives and good conductive properties.

The invention also provides a tape having conductive particles only in areas of the carrier web that correspond to electrodes to be interconnected.

As used herein, the term "carrier web", is used to mean a layer which is attached, releaseably or permanently to one or both sides of the adhesive layer. The terms "liner" and "release liner" are also used to indicate such webs, especially those which are releasably attached.

DETAILED DESCRIPTION OF THE INVENTION

The invention provides an aggressively tacky pressure-sensitive adhesive tape containing electrically conductive particles by which multiple pairs of arrayed electrodes that are closely spaced can be reliably interconnected. The novel adhesive tape is more economical than comparable tapes of the prior art, because effective interconnections may be provided with extremely low total particle loadings. Adhesives may be selected to form bonds of the bonding strength required for a particular application.

The electrically conductive adhesive tape comprises at least one flexible carrier web that has a low-adhesion face bearing an adhesive layer thereon. The layer has a substantially uniform thickness and a Lap Shear Value from aluminum (measured under ASTM D1002) of at least about 0.2 MPa, preferably at least about 1 MPa. The tape is formed with a plurality of perforations, each containing a plurality of electrically conductive particles in contact with the adhesive layer which is otherwise substantially free of electrically conductive material. The adhesive layer may be separated from the carrier web to bond two substantially flat electrically conductive surfaces together, with particles of individual perforations bridging the adhesive layer to form interconnections between those surfaces.

When the novel tape is to be used to interconnect facing arrays of electrodes, the perforations preferably are of substantially equal size. The perforations can have a variety of shapes, e.g., hemispherical, pyramidal, conical or cylindrical. The perforations may be formed by mechanical punching, and laser drilling where the laser uses lenses that divide the laser beam into multiple beams, or by replication from a negative master.

When the tape is used to interconnect closely spaced electrodes, each perforation can be less than 0.1 mm in maximum breadth. In preferred tapes of the invention, the perforations are no greater than 0.05 mm in maximum breadth and are in an orderly predetermined pattern, such as a square, triangular or hexagonal array having center-to-center spacing no greater than 0.1 mm. The adhesive layer of such preferred tape can interconnect two facing arrays of electrodes having a lateral spacing as small as 0.1 mm without danger of short circuiting.

The perforations can be formed in the carrier web, in the adhesive layer or in both. Because the size and spacing of the perforations can be controlled to ensure good electrical interconnections, the particles can be used in such small amounts that they do not detract from the adhesive properties, i.e., peel and shear, of the adhesive.

When desired, perforations can be formed only in those areas of the carrier web that correspond to electrodes to be interconnected. This reduces even further the amount of conductive particles necessary. Within those areas the perforations may be random, or may be arranged in any desired pattern. When perforations are so formed, the adhesive must be correctly oriented with respect to the electrode pairs prior to use. When perforations are in an orderly array over the entire adhesive layer, there is no need to orient the adhesive layer. Also, when the adhesive layer is continuous and void-free between the electrodes, this seals the arrays against moisture and contamination.

Useful flexible carrier webs include film-forming polymers, including polyesters, polyolefins, polymethylmethacrylates, polyurethanes and the like, and papers having polymeric coatings. The adhesive may be permanently or releasably attached to the carrier web, and webs may be provided on only one or both sides of the adhesive tape, e.g., as in a transfer tape.

Useful electrically conductive particles includes metals such as silver or nickel, metal-coated polymeric particles and graphite. When the conductive particles are soft, as described in U.S. Pat. No. 4,606,962, Reylek, incorporated herein by reference, moderate hand pressure applied to interconnecting electrodes can flatten the particles to provide a small, flat conductive area where each particle contacts another particle or an electrode.

In preferred applications, the perforations should contain not only the electrically conductive particles, but an organic binder. The binder can bind the particles in each perforation into permanently coherent columns. When used, the binder typically contributes from about 1 to about 50% by volume of the total particles.

By selecting a binder that forms a strong bond to electrically conductive surfaces, the binder can supplement the bond created by the adhesive layer, thus improving adhesion, and reducing failures under adverse conditions.

Useful organic binders include rubber resins such as styrene-butadiene, and ABS copolymers, thermosetting resins such as epoxy resins and cyanate esters, and thermoplastic resins such as phenoxys, polysulfones, polyether sulfones and polyvinylacetyl resins. Preferred binders include mixtures of thermosetting and thermoplastic resins such as those disclosed in U.S. Pat. No. 4,769,399, (Schenz), incorporated herein by reference.

Preferred electrically conductive tapes of the invention contain a reworkable adhesive as either an adhesive layer, a binder or both, preferably provided as a non-tacky or slightly tacky adhesive film, comprising the reaction product of: a) an effective amount of a thermoplastic polymer, having a $T_g$ of about 30° C. to 250° C., and b) an effective amount of a crosslinkable resin.

The crosslinkable resin preferably comprises an epoxy resin or a cyanate ester resin. The epoxy resin preferably comprises an aromatic epoxy, and may also include an epoxy curative. The epoxy resin may typically comprise one or more components individually having a molecular weight of about 200 to 2000. The cyanate ester resin may typically include one or more components individually having a molecular weight of about 150 to 2000.

The thermoplastic polymer is preferably selected from the group consisting of polysulfones, polyvinyl acetals, polyamides, polyimides, polyesters, polyetherimides, polycarbonates, polyethers, and polyvinylics.

The cured adhesive composition has a shear strength of less than about 1 megaPascals ("MPa"), preferably less than about 0.5 MPa, at a temperature of about 20° C. above the $T_g$ of the cured adhesive composition. The adhesive composition preferably has such a shear strength at the processing temperature, $T_p$, of the cured adhesive composition. $T_p$ is typically in the range of about 125° C. to 250° C., and preferably in the range of about 150° C. to 200° C.

The cured adhesive composition has a modulus of greater than about $1 \times 10^2$ MPa, preferably greater than about $1 \times 10^3$ MPa, at a temperature of about 20° C. below the $T_g$ of the cured adhesive composition.

The adhesive useful in tapes of the invention may also be selected from thermoplastic and thermosetting adhesives, rubber resin adhesives, pressure-sensitive adhesives, and the like.

In one preferred embodiment, the adhesive is the same as the binder resin. This is especially preferred when the binder resin is a reworkable adhesive, as discussed, supra. In another preferred embodiment, the adhesive layer is a pressure-sensitive adhesive. The tape is then more convenient to apply, lacking a heating requirement. A preferred class of pressure-sensitive adhesives are acrylate adhesives. They can be monomers and/or oligomers such as (meth)acrylates (meth)acrylamides, vinyl pyrrolidone and azlactones, as disclosed in U.S. Pat. No. 4,304,705, (Heilmann). Such monomers include mono-, di-, or poly-acrylates and methacrylates.

Preferred acrylates are typically alkyl acrylates, preferably monofunctional unsaturated acrylate esters of non-tertiary alkyl alcohols, the alkyl groups of which have from 1 to about 14 carbon atoms. Included with this class of monomers are, for example, isooctyl acrylate, isononyl acrylate, 2-ethyl-hexyl acrylate, decyl acrylate, dodecyl acrylate, n-butyl acrylate, and hexyl acrylate.

Preferred monomers include isooctyl acrylate, isononyl acrylate, 2-ethylhexyl acrylate, and butyl acrylate. The alkyl acrylate monomers can be used to form homopolymers or they can be copolymerized with polar copolymerizable monomers. When copolymerized with strongly polar monomers, the alkyl acrylate monomer generally comprises at least about 75% of the polymerizable monomer composition. When copolymerized with moderately polar monomers, the alkyl acrylate monomer generally comprises at least about 70% of the polymerizable monomer composition.

The polar copolymerizable monomers can be selected from strongly polar monomers such as monoolefinic mono- and dicarboxylic acids, hydroxyalkyl acrylates, cyanoalkyl acrylates, acrylamides or substituted acrylamides, or from moderately polar monomers such as N-vinyl pyrrolidone, acrylonitrile, vinyl chloride or diallyl phthalate. The strongly polar monomer preferably comprises up to about 25%, more preferably up to about 15%, of the polymerizable monomer composition. The moderately polar monomer preferably comprises up to about 30%, more preferably from about 5% to about 30% of the polymerizable monomer composition.

The pressure-sensitive adhesive matrix of the invention also contains initiator to aid in polymerization of the monomers. Suitable initiators include thermally-activated initiators such as azo compounds, hydroperoxides, peroxides, and the like, and photoinitiators such as the benzoin ethers, substituted benzoin ethers such as benzoin methyl ether or benzoin isopropyl ether, substituted acetophenones such as 2,2-diethoxy-acetophenone, and 2,2-dimethoxy-2-phenylacetophenone, substituted alpha-ketols such as 2-methyl-2-hydroxypropiophenone, aromatic sulphonyl chlorides such as 2-naphthalene sulphonyl chloride, and photoactive oximes such as 1-phenyl-1,1-propanedione-2-(O-ethoxycarbonyl) oxime. Generally, the initiator is present in an amount of from about 0.01 part to about 3.0 parts based on 100 parts monomer weight.

Where superior cohesive strengths are desired, the pressure-sensitive adhesive matrix may also be crosslinked. Preferred crosslinking agents for the acrylic pressure-sensitive adhesive matrix are multiacrylates such as 1,6-hexanediol diacrylate as well as those disclosed in U.S. Pat. No. 4,379,201 (Heilmann et al.), incorporated herein by reference. Other types of crosslinking agents are also useful, e.g., any of those taught in U.S. Pat. Nos. 4,330,590 (Vesley), and 4,329,384 (Vesley et al.), both of which are incorporated by reference. Each of the crosslinking agents is useful in the range of from about 0.01% to about 1% of the total weight of the monomers.

Another preferred class of pressure-sensitive adhesives are siloxane pressure-sensitive adhesives such as poly(dimethylsiloxane) pressure-sensitive adhesives, e.g., "DC 284", available from Dow Corning, and poly(diphenylsiloxane) containing pressure-sensitive adhesives, e.g., "GE 6574", available from General Electric Company.

A useful adhesive that becomes pressure-sensitive at elevated temperatures is disclosed in U.S. Pat. No. 4,880,683, (Stow), useful heat-hardenable adhesives are disclosed in U.S. Pat. Nos. 3,753,755 and 3,326,741, (both Olson), all of which are incorporated herein by reference.

Other useful materials which can be blended into the matrix include, but are not limited to, fillers, pigments, plasticizers, tackifiers, fibrous reinforcing agents, woven and nonwoven fabrics, foaming agents, antioxidants, stabilizers, fire retardants, and rheological modifiers.

In one preferred embodiment, the adhesive may be a foam or foam like adhesive. This adhesive may be created by the addition of blowing agents, or by frothing air or other gases into the adhesive which is then cured with such gases creating voids. A foam like tape may also be created by the addition of microspherical fillers, either glass or polymeric. When desired, these fillers must be chosen such that they do not interfere with the electrical properties desired.

Methods of making tapes of the invention include various coating techniques. For example, a low adhesive carrier web may be mechanically punched to form perforations. A slurry of the electrically conductive particles and binder, if any, is then coated onto the face, and a knife scrapes the face clean, leaving slurry only in the perforations. Binder, if present, is then cured in an oven, and a dispersion or solution of adhesive is then knife-coated or Meyer bar coated onto the carrier web. This is then cured by the means appropriate to the individual adhesive system, e.g., thermally or by exposure to moisture or radiation.

Another method of making such a tape is to first coat and cure the adhesive onto the carrier web. Laser perforation is then performed through the web and the adhesive layer. The slurry containing the conductive particles is then applied along with the requisite heat and pressure required to force the particles into the perforations.

Figure 1:
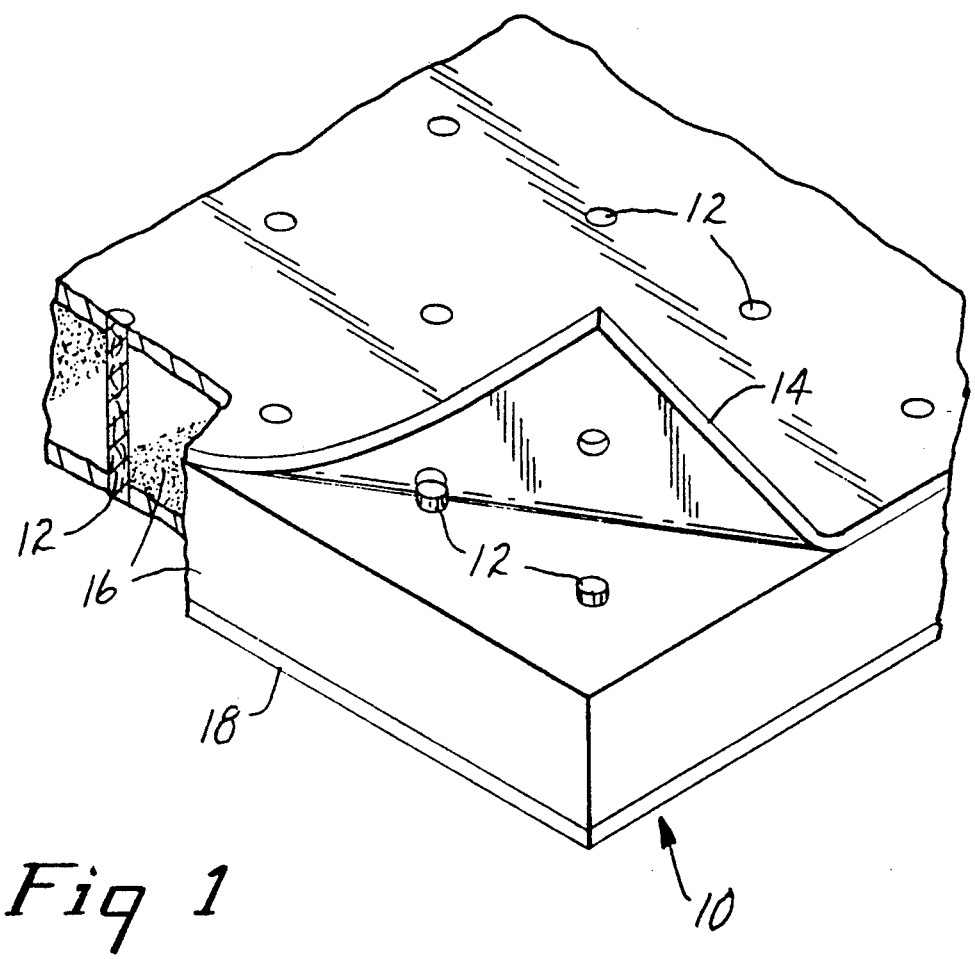
FIG. 1 is a schematic pictorial view of a sheet material of the invention.

Shown in FIG. 1 is an electrically conductive adhesive web 10 having a carrier web 18 and a cover sheet 14. The materials for the carrier web 18 and the cover sheet 14 may be the same or differing, and include the conventional materials used for tape backings, carrier webs for transfer tapes and release liners. The conductive columns 12 were made by filling perforations in the carrier web 18 adhesive 16 and cover sheet 14 with a slurry of conductive particulate. The positions and shape of conductive columns 12 may be rectangles, triangles, ellipses and combinations thereof and may have any of a variety of patterns including those that may require indexing when connecting spaced terminals or electrodes. At the time of use, the cover sheet 14 is removed to expose adhesive 16 and one end of the conductive columns 12.

The functions of the cover sheet are to prevent collapse of the conductive columns when the tape is wrapped in a roll and to protect adhesive 16 from possible contamination resulting from transfer of the material used to fill conductive columns 12. During the filling of conductive columns 12, some of the binder and/or conductive particulate may be left on either the carrier web or cover sheet (depending on which side or sides is coated). When cover sheet 14 is not required it may be omitted from the construction. Processing options that could eliminate the need for a cover sheet in the final construction are to 1) clean carrier web 18 after coating to fill the conductive columns 12 and 2) coat cover sheet 14 and then remove it prior to wrapping the tape in a roll. Likewise, some conductive columns 12 may not require the protection from collapse provided by cover sheet 14. In application of adhesive 16 to a substrate, conductive columns 12 typically contact the substrate first. When a binder is used, the amount and type (along with the conductive particulate) influences the properties of the conductive column. To this extent, the conductive columns may be designed with great latitude without the disadvantage of drastically reducing the adhesiveness of the tape or forming clumps that could short adjacent electrodes. Binders may be selected to 1) permit collapse of that portion of conductive columns 12 protruding above adhesive 16, 2) give resiliency to conductive columns 12, or 3) be an adhesive and add to the adhesive bond of adhesive 16. Large volume fractions of conductive particulate may be used in conductive columns 12 to enhance conductivity, which is the only desired location for the conductive particulate, while at the same time conserving on the total amount of conductive particulate used. This is in contrast to the prior art use of a random mixture of conductive particulate in an adhesive. For the case of a transfer tape or die cut from a transfer tape, carrier web 18 is also removed from adhesive 16 so it may be applied to a second substrate. Again, conductive columns 12 normally contact the substrate prior to adhesive 16. Adhesive 16 may be any number of adhesives including PSA, PSA foams, heat hardenable adhesives, heat hardenable PSA (U.S. Pat. Nos. 3,753,755 and 3,326,741, (both by Olson and included herein by reference), hot tackifying adhesives and combinations thereof.

EXAMPLES

EXAMPLE 1

A roll of "VHB" foam transfer tape, Scotch TM 4945, available from Minnesota Mining and Manufacturing Company, hereinafter 3M, which measured 15 cm wide and 1 mm in thickness was laminated to a second release liner of silicone-coated 50 μm thick poly(ethylene terephthalate) (PET). A laser was then used to perforate 0.5 mm diameter holes through both the first and second release liners and the adhesive. The perforations were in a square lattice array on 0.6 cm centers. A slurry was made with nickel powder, available as INCO Type 123 nickel powder from International Nickel Company, having a Fisher subsieve size of 3-7 μm, an apparent density of 1.8-2.7 gm/cc and a specific surface area of 0.34-0.44 m$^2$/gm. 19 g of the nickel powder was mixed with 4 gm of a vehicle consisting of 25 percent Kraton TM 1650, available from Shell, in toluene. The slurry was then flooded onto the first release liner and wiped with a doctor blade so as to force the slurry into the perforations. When either the first or the second release liner was subsequently removed, and viewed with a light microscope, it was observed that columns of slurry protruded above the adhesive to a height approximately equal to the thickness of the respective release liner. A section of the transfer adhesive was used to bond two 1.5 mm thick and 2.54 cm wide strips of aluminum alloy (6063 T6) together so as to form an overlap joint of 3.2 cm. In this section, were 7 perforations, all of which had been filled with the slurry. The resistance between the two stripes of aluminum was about 30 Ω.

A current of 0.4 amps was then passed through the adhesive of this example without difficulty. When 1 amp was passed through the bond, the resistance of the bond became that of an open circuit.

EXAMPLE 2

A 5 cm roll of aerospace epoxy transfer tape, available as AF-126 from 3M was laminated to a kraft paper liner, each side of which was coated with polyethylene, and the side to be used toward the adhesive was also coated with a low-adhesion top coating. Removal of either release liner left conductive posts protruding from the adhesive surface. Two strips of copper 2.5 cm in width, 0.8 mm in thickness and 10 cm in length were positioned with a section of the adhesive between them to form a 1.3 cm lap; the section of adhesive had six conductive posts. A weight of 325 gm was placed so as to compress the lap joint while it was heated to 127° C. for 40 minutes. After cooling to room temperature, the resistance of the adhesive bond was 6.6 milliohms and the two strips of copper were strongly bonded. Ten amps of current were passed through the bond without failure. The sample was tested in lap shear at a cross head rate of 0.025 cm/min. At a shear stress of 7 MPa, the sample slipped in the grips of the holder and the test was discontinued.

EXAMPLE 3

A mechanically perforated Scotchcal TM sheet, available from 3M, was used for this example. This sheet construction consists of a 50 μm polyvinylchloride film coated with 25 μm of an acrylic pressure-sensitive adhesive, and a 0.18 mm release liner which consisted of a kraft paper core, each side of which is coated with polyethylene, and the side to be used toward the adhesive is also coated with a low-adhesion top coating. The entire sheet had perforations having 0.5 mm diameters in a square lattice array on 0.7 cm centers.

The perforations were filled with a conductive slurry containing ten parts of a vehicle containing 10 percent Kraton TM 1650 in toluene, nine parts INCO 255 nickel powder and one part toluene. INCO type 255 nickel powder has a Fisher subsieve size of 2.2-2.8 μm, an apparent density of 0.5-0.65 gm/cc and a specific surface area of 0.68 m$^2$/gm.

The surface was flooded with the slurry and then wiped with a squeegee. The release liner was removed and the sample bonded to an aluminum sheet. A volt-ohm meter was used to confirm electrical conductivity from the surface of the Scotchcal TM to the aluminum sheet.

EXAMPLES 4 AND 4C

A reworkable adhesive transfer tape containing 25 microns of thermoset-based adhesive on a transparent release liner, available as 5300 from 3M Company, was perforated with a carbon dioxide laser. The holes were cone shaped throughout the adhesive thickness, having a diameter of about 0.2 mm at the adhesive release liner interface and a diameter of about 0.35 mm at the adhesive surface. The perforations were on 1 mm centers in parallel rows 0.5 mm apart.

The slurry described in Example 3 was coated into these holes from the release liner side of the transfer tape. The conductive transfer adhesive was then transferred to a 3.5 mm sheet of aluminum by first contacting the aluminum with the adhesive, heating, cooling and then removing the release liner. An aluminum disk having a diameter of 1.2 cm and a thickness of 3 mm with a shaft 8 mm in length by 3 mm in diameter was placed in an oven at 200° C. and then bonded to the aluminum sheet by means of the conductive adhesive. The resistance between the disk and the sheet was less than 0.1 ohm. A current of 10 amps was passed through this bond without failure. For comparative purposes, Example 4C was made using neat adhesive and the resistance was that of an open circuit.

EXAMPLE 5

The shear strength of the conductive transfer adhesive of Example 4 was compared to the neat adhesive of Example 4C. Lap shear values from aluminum substrates were measured according to ASTM D 1002. The lap shear values were 3.0 MPa for the conductive adhesive (Example 4), and 2.4 MPa for the neat adhesive (Example 4C). This difference in lap shear is not statistically significant. These data therefore demonstrate that the tapes of the invention can incorporate electrically conductive particles without significant reduction in lap shear.

EXAMPLE 6

A piece of the transfer tape of Example 4 about 2.5 cm in length and about 0.4 cm in width was used to adhesively bond a flexible circuit to a printed circuit board. The tape had three parallel rows of conductive columns extending over its length. The flexible circuit was 74 μm polyimide (Kapton TM, available from DuPont) with an array of 17 parallel copper traces 34 microns thick at a pitch of 1 mm. The width and the distance between the copper traces was 0.5 mm. The printed circuit board had an identical array of copper traces. The resistance of each bond between corresponding electrodes was less than 0.1 ohm and no adjacent electrodes shorted out.

What is claimed is:

1. An electrically conductive adhesive transfer tape capable of joining two electrically conductive surfaces comprising an adhesive layer, said layer having two faces, each of said faces being releasably attached to a carrier web, said layer having a substantially uniform thickness and a lap shear value from aluminum of at least 0.2 MPa, said tape having a plurality of perforations extending completely through said adhesive layer and said carrier webs, each of said perforations containing conductive particles and an adhesive binder that form conductive columns, said columns protruding above said adhesive layer to a height equal to the thickness of said carrier webs, said columns being protected from collapsing by said carrier web when said tape is wound into a roll, said adhesive layer being otherwise substantially free of electrically conductive particles.

2. An electrically conductive adhesive transfer tape according to claim 1 wherein said adhesive binder also is capable of adhesively bonding to an electrically conductive surface, thereby increasing the bond created by said adhesive layer, said binder and adhesive layer being different compositions.

3. An electrically conductive adhesive transfer tape according to claim 2 wherein said adhesive layer comprises an aggressively tacky pressure-sensitive adhesive.

4. An electrically conductive adhesive transfer tape according to claim 3 wherein said adhesive is a pressure-sensitive foam adhesive, having a thickness of at least 0.5 mm.

5. An electrically conductive adhesive transfer tape according to claim 1, wherein a piece of said tape having a length between two ends, a width between two edges, and a thickness from carrier web to carrier web wherein said tape is capable of carrying from about 5 to about 10 amps/cm$^2$ through said thickness.

6. An electrically conductive adhesive transfer tape according to claim 1 wherein said adhesive binder is a pressure-sensitive adhesive.

7. An electrically conductive adhesive transfer tape according to claim 1 wherein at least one of said adhesive layer and said adhesive binder comprises a heat-hardenable pressure-sensitive adhesive.

8. An electrically conductive adhesive transfer tape according to claim 1 wherein each of said conductive columns has a maximum breadth of about 0.1 mm.

9. An electrically conductive adhesive transfer tape according to claim 1 wherein said conductive columns are in a predetermined array selected from the group consisting of square or hexagonal arrays, and have a center-to-center spacing of no more than 0.1 mm.

10. An electrically conductive adhesive transfer tape comprising an adhesive layer and a carrier web, wherein said adhesive layer softens and flows at a bonding temperature and pressure, said layer having a substantially uniform thickness and a lap shear value from aluminum of at least 0.2 MPa, said carrier web having a plurality of perforations extending completely therethrough, each of said perforations containing a plurality of conductive particles, said adhesive layer being substantially free of electrically conductive particles.

11. An electrically conductive adhesive transfer tape according to claim 10 wherein said perforations also contain an organic binder having a higher softening temperature than said adhesive layer.

12. An electrically conductive adhesive transfer tape according to claim 10 wherein a piece of said tape has a length between two ends, a width between two edges, and a thickness from carrier web to carrier web wherein said tape is capable of carrying from about 5 to about 10 amps/cm$^2$ through said thickness.

13. An electrically conductive adhesive transfer tape according to claim 10 wherein each of said conductive columns has a maximum breadth of about 0.1 mm.

14. An electrically conductive adhesive transfer tape according to claim 10 wherein said conductive columns are in a predetermined array selected from the group consisting of square or hexagonal arrays, and have a center-to-center spacing of no more than 0.1 mm.

15. An electrically conductive adhesive transfer tape comprising a reworkable thermoset resin adhesive layer having a substantially uniform thickness and a lap shear value from aluminum of at least 0.2 MPa, said adhesive layer having two faces, and a carrier web releasably attached to at least one of said faces, said tape having a plurality of perforations extending completely through said adhesive layer and said carrier web, each perforation containing a plurality of conductive particles, said adhesive layer being otherwise substantially free of electrically conductive particles.

16. An electrically conductive adhesive transfer tape according to claim 15 wherein said perforations also contain an organic binder.

17. An electrically conductive adhesive transfer tape according to claim 15 wherein said organic binder has a higher softening temperature than said adhesive layer.

18. An electrically conductive adhesive transfer tape according to claim 15 wherein a piece of said tape having a length between two ends, a width between two edges, and a thickness from carrier web to carrier web wherein said tape is capable of carrying from about 5 to about 10 amps/cm$^2$ through said thickness.

19. An electrically conductive adhesive transfer tape according to claim 15 wherein each of said conductive columns has a maximum breadth of about 0.1 mm.

20. An electrically conductive adhesive transfer tape according to claim 15 wherein said conductive columns are in a predetermined array selected from the group consisting of square or hexagonal arrays, and have a center-to-center spacing of no more than 0.1 mm.

* * * * *